(12) United States Patent
Go (10) Patent No.: US 6,429,838 B1
(45) Date of Patent: Aug. 6, 2002

(54) CORRELATION MODULATING APPARATUS

(75) Inventor: Yong Suk Go, Kumi (KR)

(73) Assignee: LG. Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/169,470

(22) Filed: Oct. 9, 1998

(30) Foreign Application Priority Data

Feb. 25, 1998 (KR) .............................. 98/6029

(51) Int. Cl.[7] .................................. H04J 3/06
(52) U.S. Cl. ..................... 345/87; 345/155; 341/110; 341/117; 341/126; 341/144; 382/232; 382/233; 382/235; 382/251
(58) Field of Search ................... 315/367; 341/110, 341/117, 126, 144; 395/889; 706/36; 345/87, 155; 382/232, 233, 235, 251

(56) References Cited

U.S. PATENT DOCUMENTS

| | | | | |
|---|---|---|---|---|
| 4,348,659 A | * | 9/1982 | Fujimori et al. | 341/58 |
| 5,408,498 A | | 4/1995 | Yoshida | |
| 5,504,751 A | * | 4/1996 | Ledzius et al. | 341/144 |
| 5,585,796 A | * | 12/1996 | Svensson et al. | 341/155 |
| 5,926,515 A | * | 7/1999 | Park | 375/376 |
| 5,944,317 A | * | 8/1999 | Rohrbaugh | 273/372 |
| 6,047,380 A | * | 4/2000 | Nolan et al. | 713/324 |

FOREIGN PATENT DOCUMENTS

| | | |
|---|---|---|
| JP | 49-017115 | 2/1974 |
| JP | 60-239141 | 11/1985 |
| JP | 01-243623 | 9/1986 |
| JP | 61-281734 | 12/1986 |
| JP | 64-14631 | 1/1989 |
| JP | 1-243623 | 9/1989 |
| JP | 3-258025 | 11/1991 |
| JP | 5-14420 | 1/1993 |
| JP | 06-095618 | 4/1994 |
| JP | 06-120929 | 4/1994 |
| JP | 05-014420 | 4/1995 |
| JP | 09-258686 | 10/1997 |

* cited by examiner

Primary Examiner—Bipin Shalwala
Assistant Examiner—Vincent E. Kovalick
(74) Attorney, Agent, or Firm—McKenna, Long, Alridge, LLP (57) ABSTRACT

A correlation modulating apparatus that is adapted to modulate high frequency data into low frequency signals. In the apparatus, a register lists in parallel a data bit stream by at least two bit using a key clock having less frequency than a data clock. A converter converts the listed at least two bit data into an analog signal. A frequency of the analog signal is lowered into below at least ½ compared with that of the data bit stream.

12 Claims, 6 Drawing Sheets

CORRELATION MODULATING APPARATUS

BACKGROUND OF THE INVENTION

1. Field of the Invention

This invention relates to a correlation modulating apparatus for compressing and modulating a serial bit stream into an amplitude signal. Also, this invention is directed to a correlation demodulating apparatus for demodulating a correlation modulated amplitude signal. Further, this invention relates to a data interface using a correlation modulation and demodulation and to a liquid crystal display employing the data interface.

2. Description of the Prior Art

Recently, an amount of information, such as text information and video information, transferred over a is transfer medium has been increasing in comparison to that of audio information since the audio information started to be transferred. Particularly, video information is required to have higher bandwidth to meet the demand necessitated by use of high quality images. Further, the information must be transferred at a high speed so that a user may use it at a proper time. Due to this, a high frequency band is required to transmit a large quantity of information.

Figure 1:
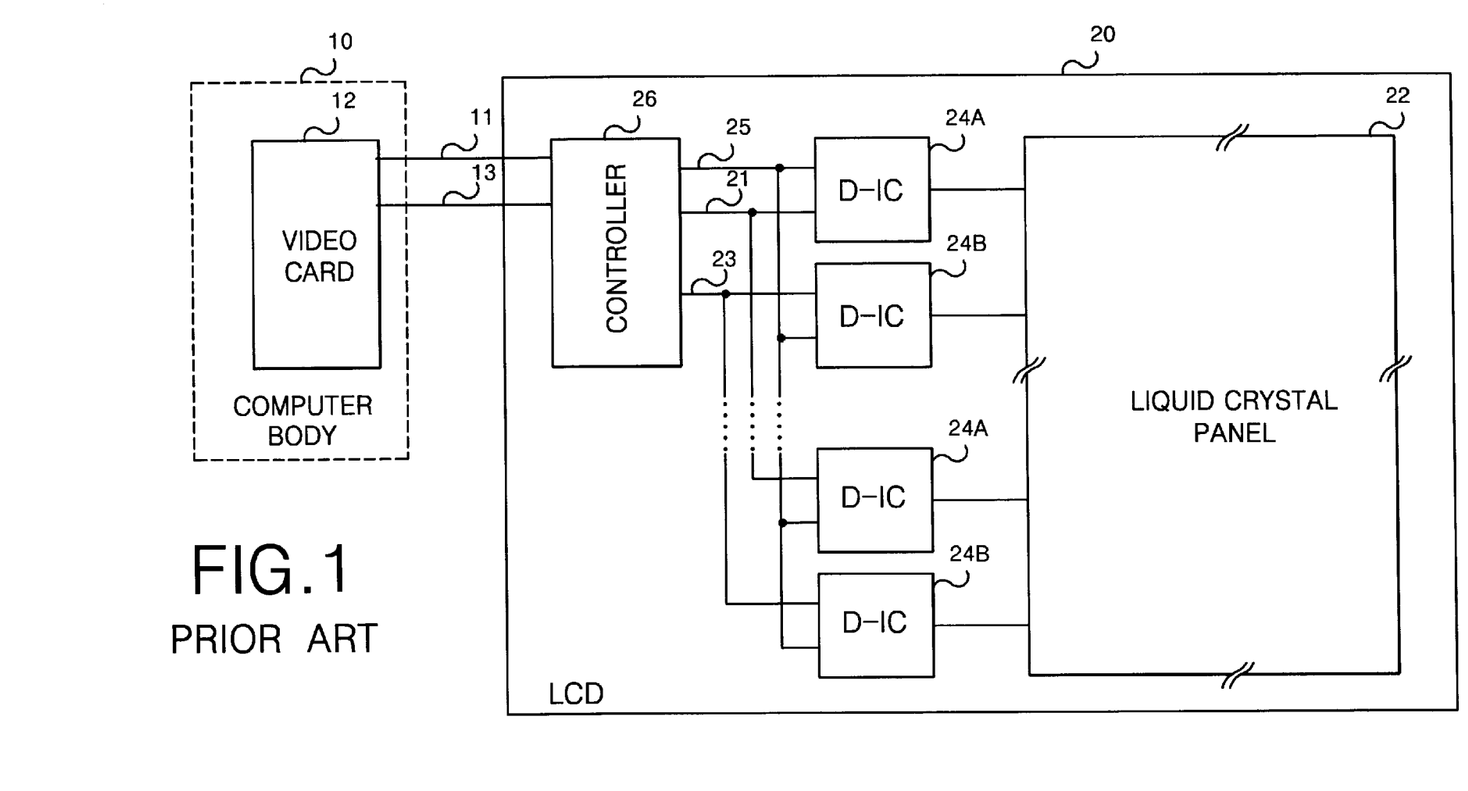
FIG. 1 is a schematic block diagram of a conventional computer system employing a liquid crystal display.

For example, in a computer system employing a liquid crystal display(LCD) as shown in FIG. 1, the video data transferred from a video card 12 in the computer body 10 to an LCD 20 needs a higher frequency as the picture resolution increases. That is, as the number of picture elements or pixels become greater, a large quantity of video information must be supplied within a given time period. Specifically, since more pixels are included in a liquid crystal panel 22 as the resolution mode of picture changes from the VGA to the XGA or SXGA mode, the quantity of the video data for one picture image increases. Accordingly, the video data transfer frequency from the video card 12 in the computer body 10 to the LCD 20 must be increased. As the frequency of the video data increases as discussed above, an electromagnetic interference(EMI) becomes a serious factor and a timing error occurs more frequently in the LCD 20. Also, the LCD 20 must have driver integrated circuits 24, (D-ICs) and a controller 26 which are capable of responding to high frequency signals.

In order to reduce a response frequency of the D-ICs 24, the LCD 20 adopts a scheme of making the bus lines between each D-IC 24 and the controller 26 in a dual line structure. In this case, a main bus line 11 consisting of 18-bit lines is connected between the video card 12 and the controller 26, and first and second sub-bus lines 21 and 23 each consisting of 18-bit lines are connected between the controller 26 and the D-ICs 26. The first sub-bus line 21 is commonly connected to odd-numbered D-ICs 24A and the secondsub-bus line 23 is commonly connected to even-numbered D-ICs 24B. Further, a main clock line 13 is connected between the video card 12 and the controller 26, and a sub-clock line 25 is connected between the controller 26 and the D-ICs 24. The controller 26 receives the video data from the main bus line 11 comprising 18-bit unit in every one-half clock period of a data clock DCLK provided through the main clock line 13. The odd-numbered D-ICs 24A receive the 18-bit video data from the first sub-bus line 21 in every rising edge of the data clock DCLK, via the sub-clock line 25, from the controller 26. The even-numbered D-ICs 24B receive the 18-bit video data from the second sub-bus line 23 in every falling edge of the data clock DCLK. The response frequencies of the D-ICs 24 are reduced by such a dual bus line structure.

In the dual bus line structure, however, because the number of signal lines are increased, the design flexibility of the LCD is limited and the fabrication cost of the LCD increases. Further, in an LCD having the dual bus line structure, the EMI and the timing errors are problematic because the video data are supplied to the controller and the D-ICs at a high frequency. Therefore, modulating and interfacing techniques are needed for transferring a large quantity of data at a low frequency.

SUMMARY OF THE INVENTION

Accordingly, it is an object of the present invention to provide a correlation modulating apparatus that is adapted to modulate high frequency data into low frequency signals.

Further object of the present invention is to provide a correlation demodulating apparatus that is adapted to demodulate the low frequency signals modulated with said modulation method to the high frequency data.

Another object of the present invention is to provide a data interfacing apparatus that is adapted to interface high frequency data at a low frequency.

Still another object of the present invention is to provide a liquid crystal display that is suitable for inputting high frequency data from a computer system in a form of low frequency signal.

In order to achieve these and other objects of the invention, a correlation modulating apparatus according to one aspect of the present invention includes means for receiving a data bit stream synchronized with a data clock; means for generating a key clock having less frequency than the data clock; means for listing, in parallel, at least two bit data in the data bit stream using the key clock; and signal converting means for converting the listed at least two bit data into an analog signal.

A correlation demodulating apparatus according to another aspect of the present invention includes means for receiving an analog signal, in which at least two bit data are compressed, and a key clock synchronized with the analog signal; quantizing means for quantizing the analog signal from the receiving means; coding means for coding the quantized analog signal to reconstruct at least two bit parallel data; and reverse aligning means for aligning the at least two bit parallel data in a line using the key clock.

A data interfacing apparatus according to still another aspect of the present invention includes correlation modulating means for correlating a data bit stream from a data source by at least two bit and for modulating the correlated data bit stream into an analog signal; and correlation demodulating means being provided in a data terminal for demodulating the data bit stream by developing the analog signal into the at least two bit data using the correlation modulating means.

A liquid crystal display according to still another aspect of the present invention includes driver integrated circuits for divisionally driving a liquid crystal panel with at least two bit video data; signal input means for inputting a single analog signal, in which the data bit stream is correlatively modulated by at least two bit; and correlation demodulating means for demodulating the data bit stream by developing the analog signal from the signal input means into the at least two bit data and for supplying the demodulated data bit stream to the driver integrated circuits.

BRIEF DESCRIPTION OF THE DRAWINGS

These and other objects of the invention will be apparent from the following detailed description of the embodiments of the present invention with reference to the accompanying drawings.

DETAILED DESCRIPTION OF THE PREFERRED EMBODIMENT

Figure 2:
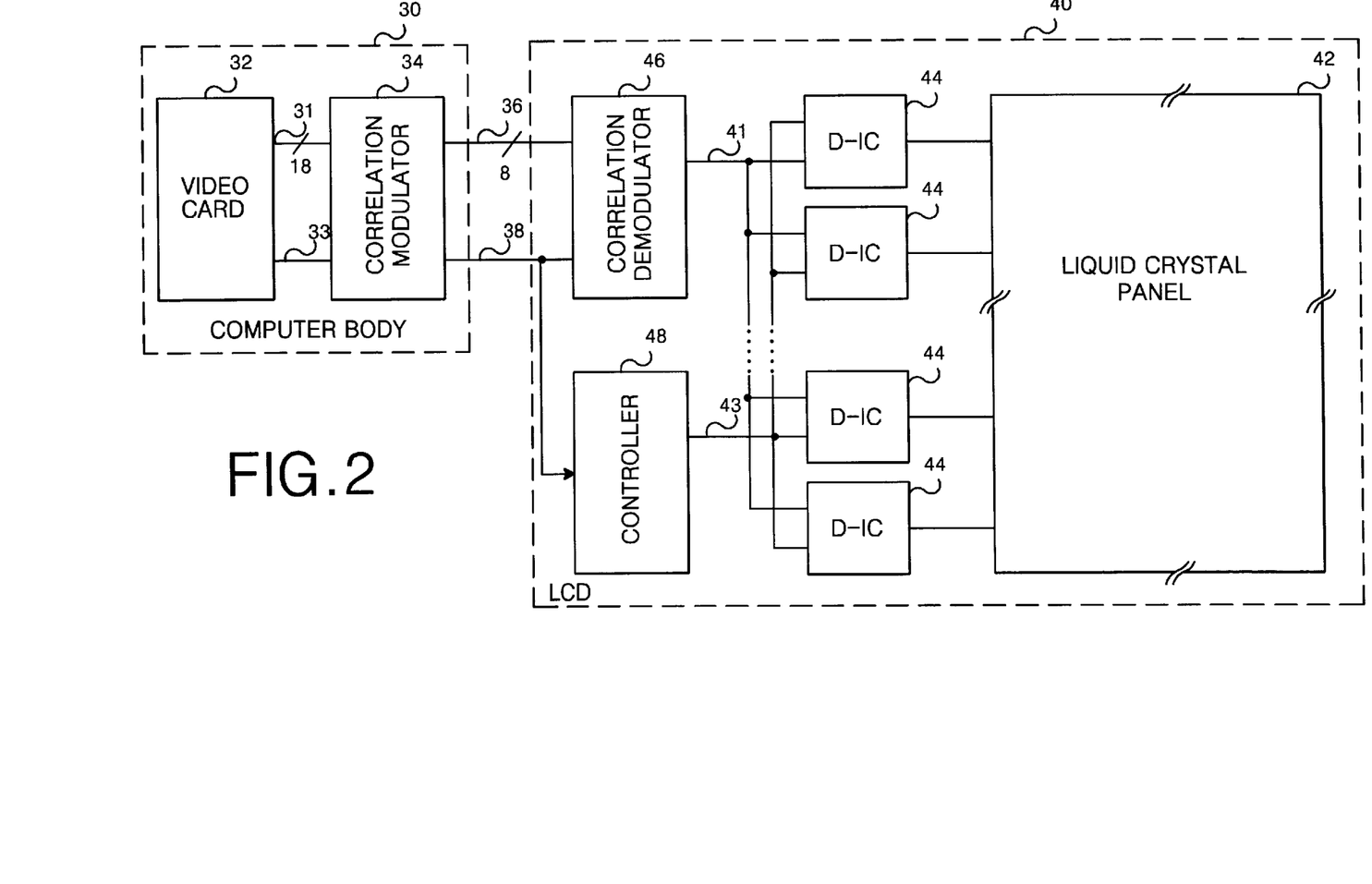
FIG. 2 schematically illustrates a liquid crystal display using a correlation modulator and a correlation demodulator according to a preferred embodiment of the present invention.

Referring to FIG. 2, there is shown a computer system to which an interfacing device adopting the correlation modulation device according to a preferred embodiment of the present invention is applied. As shown in FIG. 2, the computer system includes a computer body 30 loaded with a video card 32 and a correlation modulator 34, and an LCD 40 connected to the correlation modulator 34. The video card 32 is responsible for converting an information including text, image and so on into video data in such a manner that the information is displayed as a picture image on the LCD 40.

The video data generated from the video card 32 include red(R), green(G), and blue(B) data for each pixel. Each R, G, and B data has a 6-bit length, and hence the video data m has an 18-bit length for each pixel. Such video data VD are supplied, via a first bus line 31 having 18-bit lines, to the correlation modulator 34. At this time, the video data VD are transferred in conformity to a data clock DCLK applied from the video card 32, via a first clock line 33, to the correlation modulator 34.

The correlation modulator 34 then generates one or more frequency-divided clocks by frequency-dividing the data clock DCLK from the clock line 331. Preferably, one or more frequency-divided clocks have frequencies equal to about $½^n$ times the data clock DCLK, where n is an integer. The correlation modulator 34 correlatively modulates a video bit stream input sequentially over the bit lines constructing the first bus line using at least one frequency division clock for each bit line. Specifically, the correlation modulator 34 converts at least two bit data at the time axis, that is, multi-bit data including current bit data and at least one bit data into an amplitude every half period of a clock frequency-divided by two, that is, every period of data clock(DCLK), thereby generating a correlation modulated signal. An amplitude of the correlation modulated signal changes in accordance with a logical value of the multi-bit data every half period frequency-divided by two.

According to the above correlation modulation, 18 correlation modulated signals, hereinafter referred to as "correlation modulated data" are generated at the correlation modulator 34. The correlation modulated data are supplied as the correlation modulated video data. The correlation modulated data generated at the correlation modulator 34 are transferred over a data transmission line consisting of 18 bit transmission lines. Also, the correlation modulator 34 determines and transfers a key clock (KCLK) over a key transmission line 38 to be used to demodulate the correlation modulated signal. The frequency of the key clock KCLK is equal to one-half of the data clock DCLK. A data period of the correlation modulated signal is represented by the key clock KCLK. In order to generate the 18 correlation modulation signals in this manner, the correlation modulator 34 includes 18-correlation modulating cells to be connected to each of the 18-bit lines consisting of the first bus line.

The LCD 40 includes a number of D-ICs 44 for divisionally driving the pixels on a liquid crystal panel 42, and a correlation demodulator 46 and a controller 48 for commonly receiving the key clock KCLK from the key transmission line 38. The correlation demodulator 46 receives the correlation modulated data which includes the 18-correlation modulated signals from the data transmission line 36. In order to demodulate the correlation modulated data, the correlation demodulator 46 includes the 18-correlation demodulating cells(not shown) responding to each of the 18-correlation modulated signals constructing the correlation modulated data.

Each correlation demodulating cell quantizes the correlation modulated signal and codes the quantized correlation modulated signal into a two or more multi-bit signal. Then, it lists the multi-bit signal in the form of bit stream using the key clock KCLK to generate a video bit stream. The video bit stream demodulated in this manner has at least twice the frequency than that of the correlation modulated signal, that is, a frequency corresponding to twice the key clock frequency.

The 18-bit video data are constituted by aggregating the 18-video bit stream demodulated with the 18-correlation demodulating cells. The high frequency video data demodulated in this manner are commonly supplied, via the second bus line 41 consisting of the 18-bit lines, to the D-ICs 44. Meanwhile, the controller 48 receiving the key clock KCLK from the key transmission line 38 generates a control signal CTLS, which allows the input operation of the D-ICs 44 to be sequentially carried out, using the key clock KCLK. This control signal CTLS is commonly applied, via a control line 43, to the D-ICs 44. The D-ICs 44 receive a certain amount of video data from the second bus 41 sequentially in response to the control signal CTLS from the control line 43. The video data, for example, for one pixel line inputted distributively by the D-IC 44 are simultaneously applied to the liquid crystal panel 42 to drive the pixels comprising one display line. Such an operation of the D-ICs 44 and the liquid crystal panel 44 is repeated for the number of pixel Lines in the liquid crystal panel 42 for displaying one picture frame.

As described above, since two or more bit data arranged at the time axis are correlated in the form of an amplitude signal with the correlation modulator 34, a frequency of the video data transferred over the data transmission line 36 is lowered by at least ½ and a power consumed for the transfer of the video data is reduced. As a result, an EMI in the video data is sufficiently reduced.

Moreover, if the correlation demodulator 46 is implemented in each D-IC 44 and the data transmission line 36 and the key transmission line 38 are commonly connected to the D-ICs 44, the EMI generated in the video data transferred from the video card 32 to the D-ICs 44 is minimized and a wiring structure between the controller 48 and the D-IC 44 is simplified.

Figure 3:
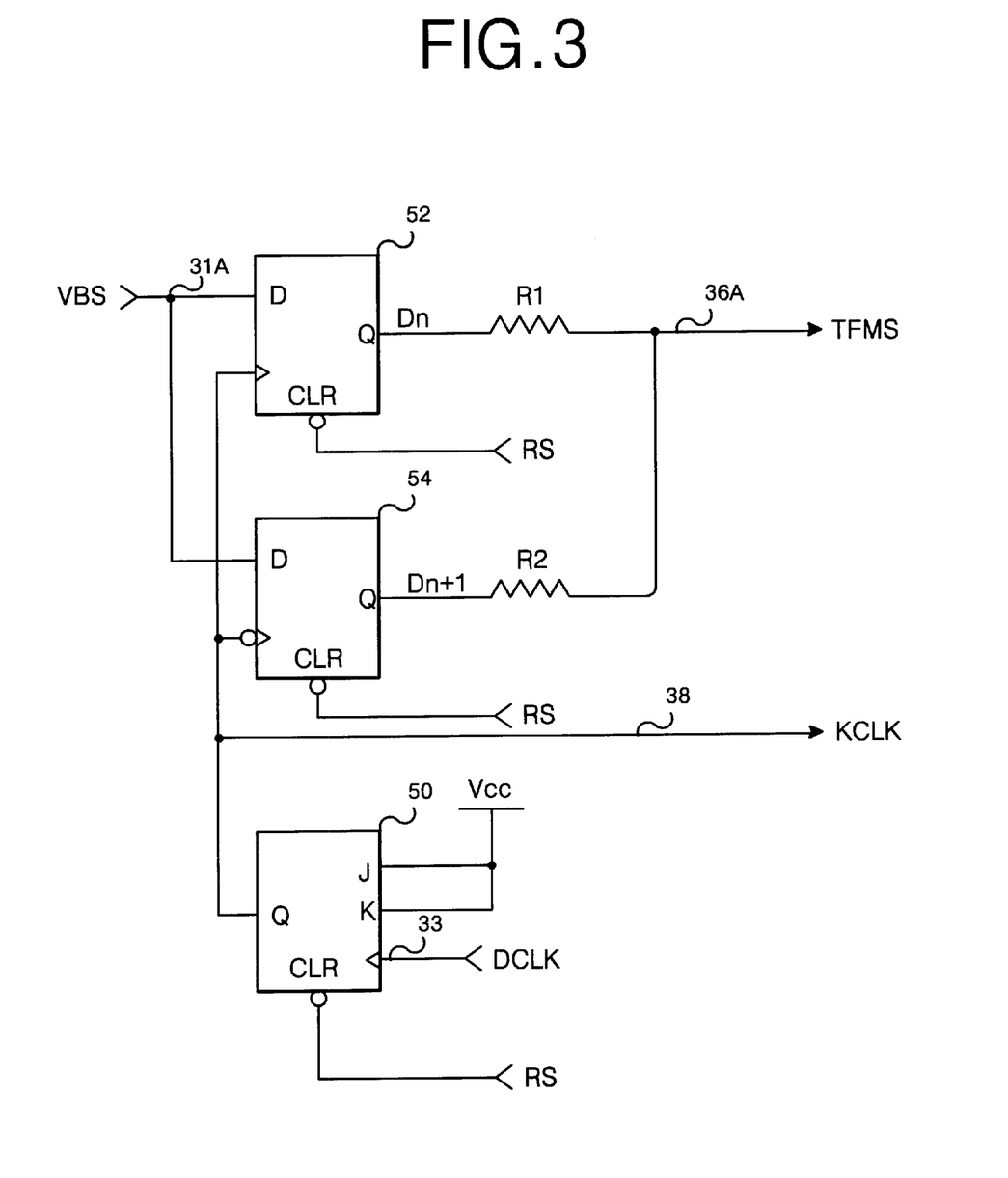
FIG. 3 is a block diagram of the correlation modulator shown in FIG. 2.

FIG. 3 shows a correlation modulating cell included in the correlation modulator 34 shown in FIG. 2. As shown in FIG. 3, the correlation modulating cell includes a first J-K flip-flop 50, preferably a J-K flip-flop responding to the data clock DCLK from the clock line 33, and second and third flip-flops 52 and 54, preferably delay flip-flops, receiving a video stream VBS from a bit line 31A. The first to third flip-flops 50 to 54 are initialized by a reset signal RS applied to the respective clear terminals upon initiation of the computer system, thereby preventing a false operation which may occur at the time of initiation.

Figure 4:
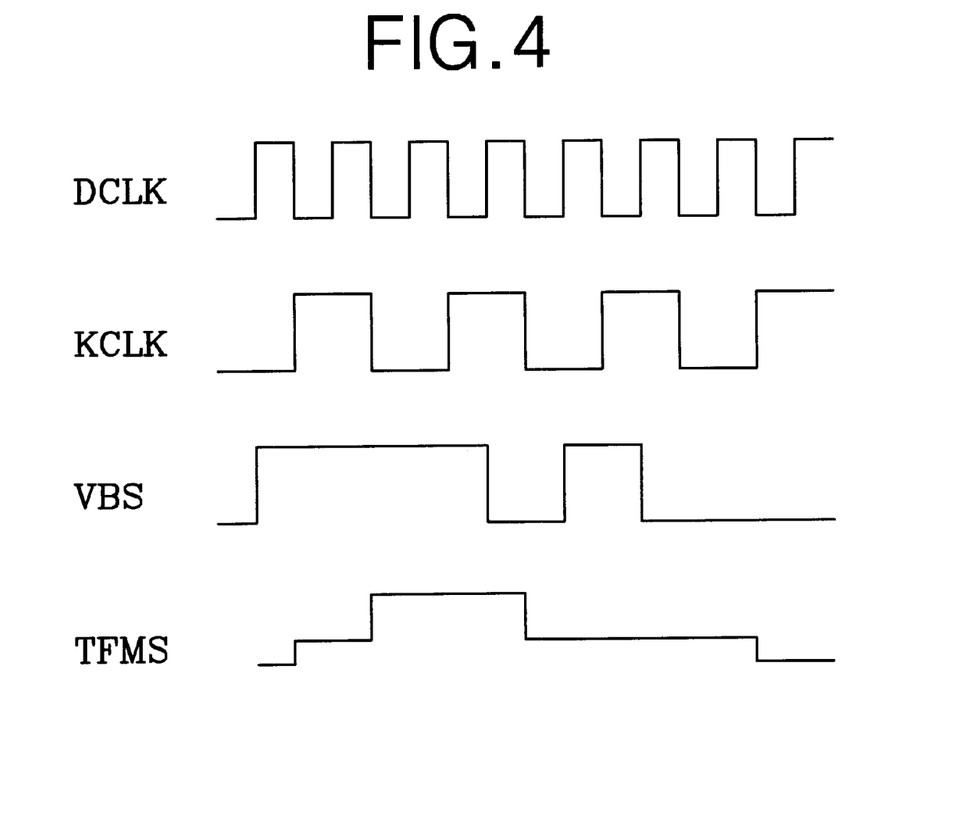
FIG. 4 shows output waveforms of each component of the correlation modulator shown in FIG. 3.

The first flip-flop 50 inverts a logical state on the output terminal Q thereof from a high state into a low state or vice versa every falling edge of the data clock DCLK as shown in FIG. 4. In effect, the first flip-flop 50 frequency-divides the data clock DCLK applied to the clock terminal CLK thereof by two. The output of the first flip-flop 50 is used as a key clock KCLk, which is applied to the key transmission line 38 and the clock terminals CLK of the second and third flip-flops 52 and 53.

The second and third flip-flops 52 and 54 respond to the key clock KCLK to correlate the bit data of the video bit stream VBS received from the bit line 31A with the preceding bit data and the subsequent bit data by one-half period of the key clock KCLK. To this end, the second flip-flop 52 delivers the video bit stream VBS received from the bit line 31A to the output terminal Q thereof at every rising edge of the key clock KCLK while the third flip-flop 54 delivers the video bit stream VBS received from the bit line 31A to the output terminal Q thereof at every falling edge of the key clock KCLK. As a result, odd-numbered video data Dn and even numbered video data Dn+1 are successively outputted to the output terminal Q of the second flip-flop 52 and the output terminal Q of the third flip-flop 54, respectively. The odd-numbered and even-numbered video data Dn and Dn+1 have the same frequency as the key clock KCLK while having a phase difference of 180° with respect to each other.

The correlation modulating cell includes a first resistor R1 connected between the output terminal Q of the second flip-flop 52 and the bit transmission line 36A, and a second resistor R2 connected between the output terminal Q of the third flip-flop 54 and the bit transmission line 36A. The first resistor R1 drops a voltage signal from the output terminal Q of the second flip-flop 52 into ⅓ thereof and delivers the dropped voltage signal to the bit transmission line 36A. The second resistor R2 drops a voltage signal from the output terminal Q of the third flip-flop 54 into ⅔ thereof and delivers the dropped voltage signal to the bit transmission line 36A. Accordingly, a correlation modulated signal TFMS being the sum of the voltage signals dropped by the first and second resistors R1 and R2 emerges at the bit transmission line 36A. This correlation modulated signal TFMS has an amplitude varying every half period of the key clock KCLK, that is, every period of the data clock DCLK in accordance with a logical value of two bit data stored in the second and third flip-flops 52 and 54. Also, the correlation modulated signal TFMS has an average voltage corresponding to ½ of the video bit stream VBS to consume only about ¼ the power compared with the video bit stream VBS. As a result, the first and second resistors R1 and R2 convert two bit data into an amplitude signal. To this end, the first and second resistors R1 and R2 are set to have a resistance value ratio of 2 to 1.

Figure 5:
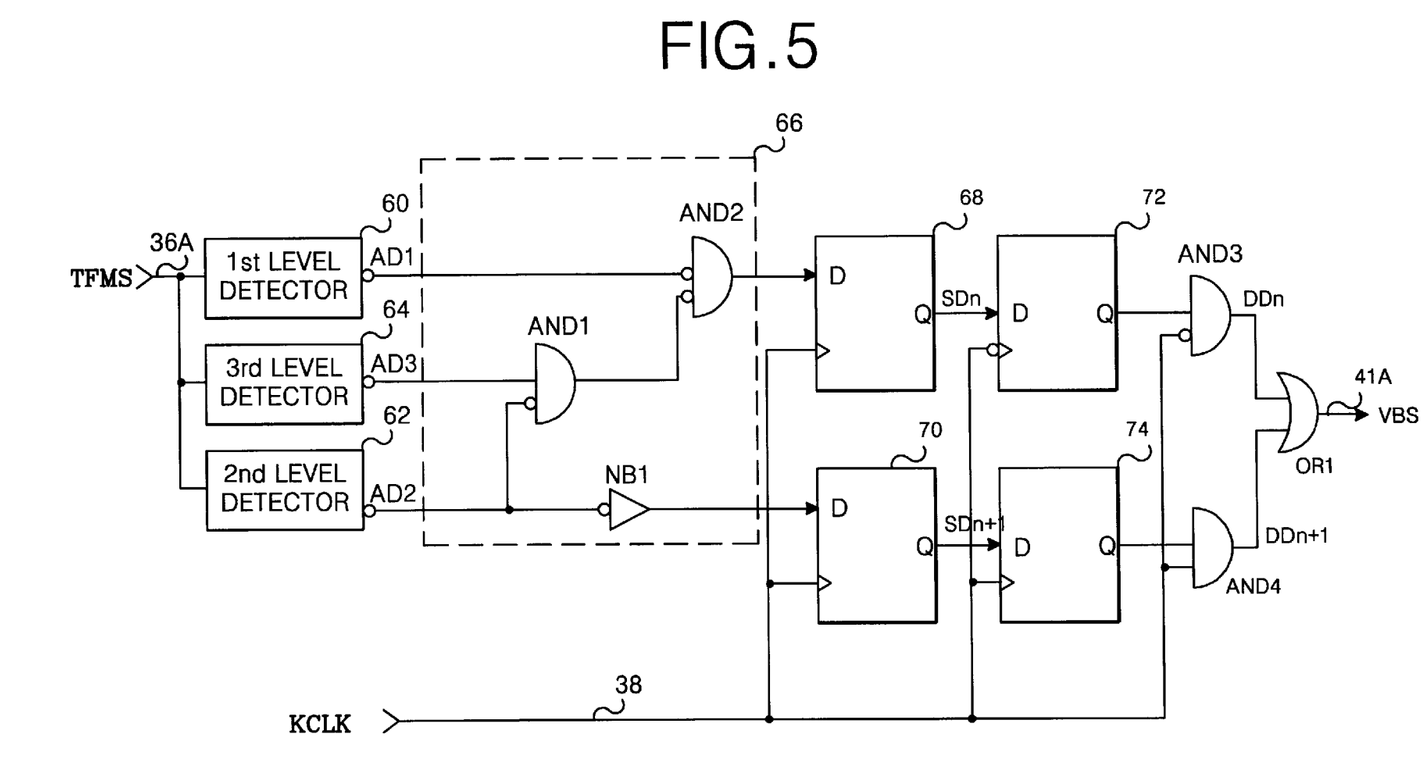
FIG. 5 is a block diagram of the correlation demodulator shown in FIG. 2.
Figure 6:
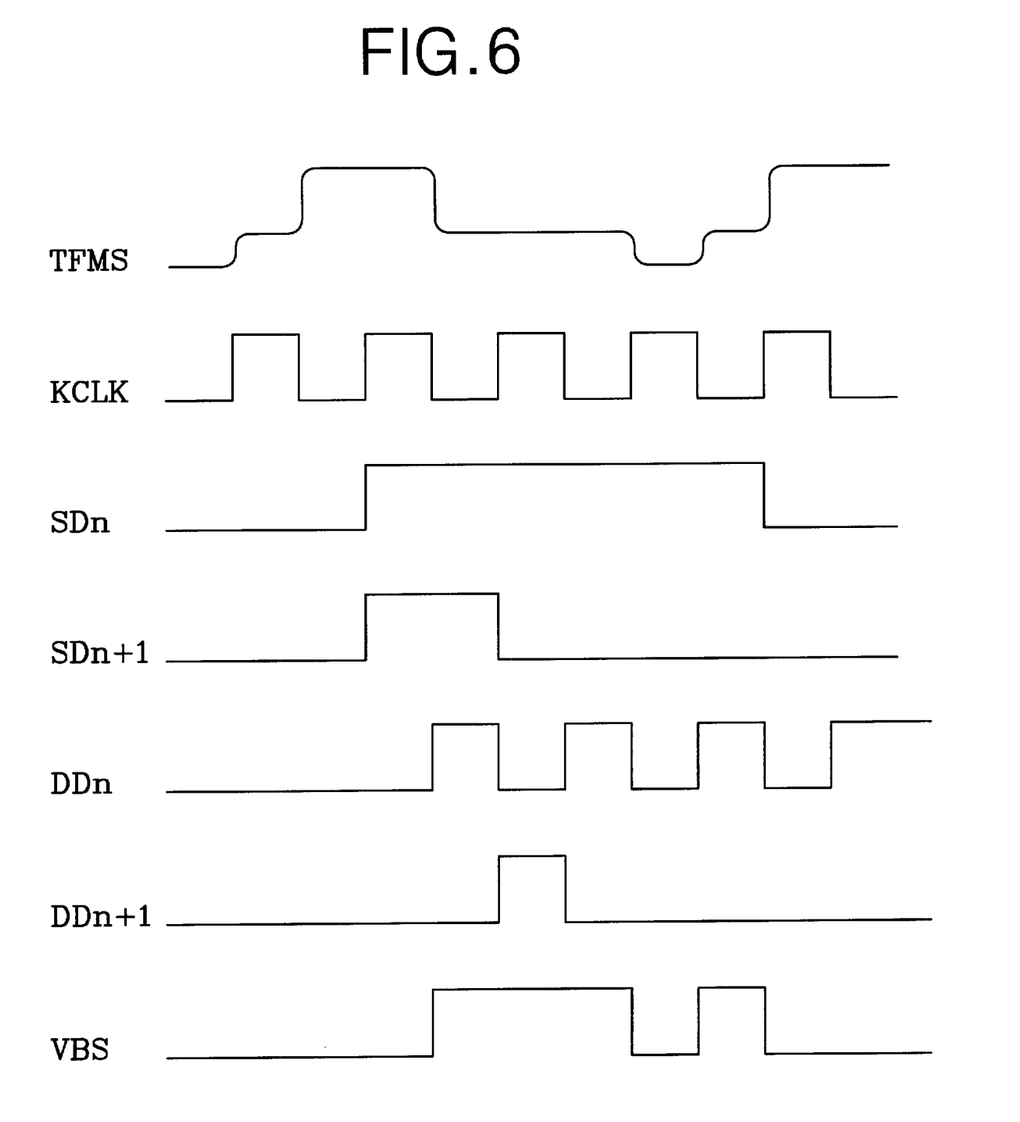
FIG. 6 shows output waveforms of each component of the correlation demodulator shown in FIG. 5.

FIG. 5 is a schematic circuits diagram of the correlation demodulating cell included in the correlation demodulator 46 shown in FIG. 2. FIG. 6 is an operational timing diagram of each component of the correlation demodulating cell shown in FIG. 5. As shown in FIG. 5, the correlation demodulating cell includes first to third level detectors 60 to 64 commonly connected to the bit transmission line 36A, and a coder 66 for coding output signals of the level detectors 60 to 64. The first to third level detectors 60 to 62 detect a voltage level or amplitude of the correlation modulated signal TFMS shown in FIG. 6 received from the bit transmission line 36A. The first level detector 60 generates, for example, a low logic level for first amplitude detection signal AD1 when the correlation modulated signal TFMS is higher than a first predetermined level, i.e., Vh/3. The second level detector 62 generates, for example, a low logic level for second amplitude detection signal AD2 when the correlation modulated signal TFMS is higher than a second predetermined level, i.e., Vh/2. The third level detector 64 generates, for example, a high logic level for third amplitude detection signal AD3 when the correlation modulated signal TFMS is more than a third predetermined voltage level, i.e., Vh.

The first to third level detection signals AD1 to AD3 indicate amplitude values which are quantized values of the correlation modulated signal TFMS. As a result, the first to third level detectors 60 to 64 performs a function of quantizing the correlation modulated signal TFMS.

The coder 66 codes the amplitude values assigned by the first to third amplitude detection signals AD1 to AD3 from the first to third level detectors 60 to 64 to, for example, two bit data. The high order bit data and the low order bit data coded by the coder 66 are used as odd-numbered bit data Dn and even-numbered bit data Dn+1, respectively. The second level detection signal AD2 generated at the second level detector 62 is used as the even-numbered bit data Dn+1. On the other hand, the odd-numbered bit data Dn are generated by logically combining the first to third level detection signals AD1 to AD3. To this end, the coder 66 includes first and second AND gates AND1 and AND2, and a negative logic buffer NB1.

The correlation demodulating cell shown in FIG. 5 includes fourth to seventh flip-flops 68 to 74, preferably delay flip-flops, jointly responding to the key clock KCLK from the key transmission line 38. The fourth and fifth flip-flops 68 and 70 synchronize the odd-numbered and even-numbered bit data Dn and Dn+1 coded by means of the coder 66 with the key clock KCLK, respectively. More specifically, the fourth flip-flop 68 delivers the odd-numbered bit data Dn from the second AND gate AND2 to the output terminal Q thereof in every rising edge of the key clock KCLK to supply the synchronized odd-numbered bit data SDn to the output terminal Q of the sixth flip-flop 172. Likewise, the fifth flip-flop 70 delivers the second level detection signal AD2 from the second level detector 622 to the output terminal Q thereof in every rising edge of the key clock KCLK to thereby supply the synchronized odd-numbered bit data SDn to the output terminal Q of the sixth, flip-flop 72.

The sixth and seventh flip-flops 72 and 74 control the phases of the 2-bit data SDn and SDn+1 in such a manner that the synchronized odd-numbered bitidata SDn and the synchronized even-numbered bit data SDn+1 have a phase difference of 180° with respect to each other. To this end, the sixth flip-flop 72 delivers the synchronized odd-numbered bit data SDn from the fourth flip-flop 68 to the output terminal Q thereof in every falling edge of the key clock KCLK, and the seventh flip-flop 74 delivers the synchronized even-numbered bit data SDn+1 from the fifth flip-flop 70 to the output terminal Q thereof in every rising edge of the key clock KCLK.

The correlation demodulating cell shown in FIG. 5 further includes third and fourth AND gates AND3 and AND4 commonly inputting the key clock KCLK from the key transmission line 38, and an OR gate OR1 connected to the AND gates AND3 and AND4. The AND gates AND3 and AND4 shorten the period of odd-numbered and even-numbered data from the sixth and seventh flip-flops 72 and 74, respectively, into one-half period of the key clock KCLK. In other words, they increase the frequencies of the bit data to twice the frequency of the key clock KCLK. Specifically, the AND gate AND3 demodulates the odd-numbered video bit data DDn by performing an AND operation of the odd-numbered bit data from the sixth flip-flop 72 with the inverted key clock KCLK. The AND gate AND4 demodulates even-numbered video bit data DDn+1 by performing an AND operation of the even-numbered bitidata with the key clock KCLK.

The odd-numbered video bit data DDn demodulated by the AND gate AND3 and the even-numbered bit data demodulated by the AND gate AND4 cross each other. Finally, the OR gate OR1 performs an OR operation of the demodulated odd-numbered video bit data DDn from the AND gate AND3 with the demodulated even-numbered video bit data DDn+1 from the AND gate AND4, thereby demodulating the video bit stream VBS in which the video bit data DDn and DDn+1 emerge alternately. The video bit stream VBS demodulated in this manner is commonly supplied, via a second bit line 41A constructing a second bus line 41, to the D-ICs 44.

Figure 7:
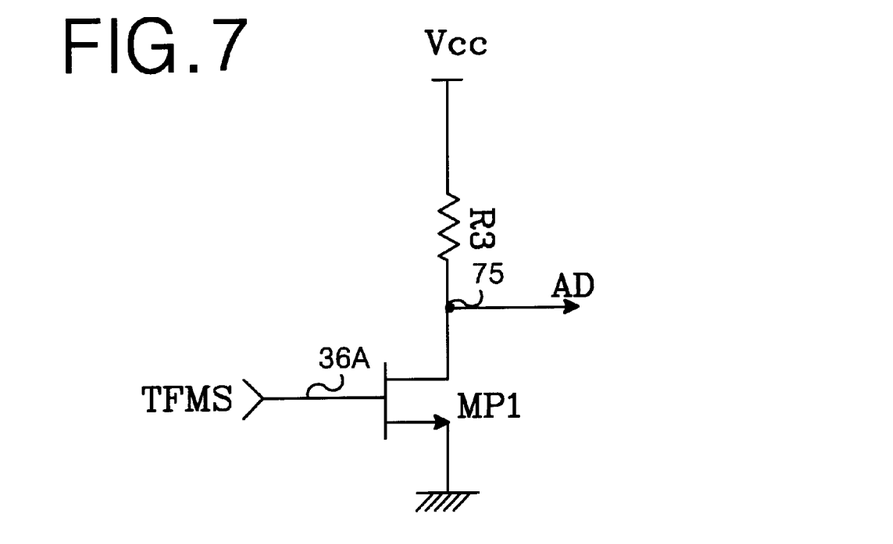
FIG. 7 shows a preferred embodiment of the level detectors shown in FIG. 5.

FIG. 7 illustrates a preferred embodiment of the level detectors 60 to 64 shown in FIG. 51. Each one of the level detectors 60 to 64 includes an NMOS transistor MP1 receiving a control signal from a bit transmission line 36A, and connected between a ground GND and a node 75, and a third resistor R3 connected between a node 75 and a power supply Vcc. The NMOS transistor MP1 bypasses a voltage at the node 75 to the ground GND when the correlation modulated signal TFMS received from the bit transmission line 36A to the gate terminal thereof is greater than a threshold voltage Vth, thus generating a low logic level for the amplitude detection signal AD. The NMOS transistor MP1 opens the node 75 from the ground GND when the correlation modulates signal TFMS received from the bit transmission line 36A to the gate terminal thereof is less than the threshold voltage Vth, thus generating a high logic level for the amplitude detection signal AD on the node 751.

The threshold voltage Vth of the NMOS transistor MP1 is determined depending on the voltage levels to be detected by the level detectors 60 to 64. Specifically, the threshold voltage Vth of the NMOS transistor MP1 is set to about 0 to Vcc/3 in the case of the first level detector 60 detecting a voltage corresponding to ⅓ of the supply voltage Vcc, to about Vcc/3 to Vcc×⅔ in the case of the second level detector 62 detecting a voltage corresponding to ⅔ of the supply voltage Vcc, and to about Vcc×⅔ to Vcc in the case of the third level detector 64 detecting a voltage corresponding to the supply voltage Vcc. Accordingly, an amplitude detection signal AD generated at the node 75 has a high logic when the correlation modulated signal TFMS is less than the subject detecting voltage while having a low logic when the correlation modulated signal TFMS is higher than the subject detecting voltage.

As described above, in the correlation modulator according to the present invention, since 2 sequential bit data are correlated in the form of an amplitude signal, the frequency of the transfer data can be decreased and the power consumption for transmitting data may be decreased as much as ¼. Accordingly, the correlation modulated signal generated by the correlation modulator according to the present invention generates lower EMI.

Further, in the interface unit according to the present invention, two or more sequential bit data are transferred correlatively in the form of amplitude signal, thereby lowering the transmission frequency band as well as reducing the power consumption. Accordingly, the data transferred through the interface unit according to the present invention can withstand the EMI.

Likewise, in the LCD according to the present invention employing the above-mentioned interface unit, the data transmission frequency band is lowered and the power consumed for the data transmission is reduced. As a result, the LCD according to the present invention is capable of minimizing an affect of EMI. Also, if the correlation demodulator is loaded in the D-ICs and the data transmission line and the key transmission line is commonly connected to the D-ICs, then the LCD according to the present invention is capable of minimizing an EMI affect on the video data transferred from the video card to the D-ICs as well as simplifying the wiring structure thereof.

Although the present invention has been explained by the embodiments shown in the drawings described above, it should be understood to the ordinary skilled person in the art that the invention is not limited to the embodiments, but rather that various changes or modifications thereof are is possible without departing from the spirit of the invention. Accordingly, the scope of the invention shall be determined only by the appended claims and their equivalents.

What is claimed is:

1. A correlation demodulating apparatus, comprising:

means for receiving an analog signal formed by compressing at least two parallel bit data and a key clock synchronized with the analog signal;

quantizing means for quantizing the analog signal from the receiving means to form a quantized analog signal, wherein the quantizing means includes at least ($2^n-1$) level detectors connected in parallel between the receiving means and the coding means, each level detector being configured to detect different voltage levels of the analog signal, wherein each of the at least ($2^n-1$) level detectors comprises:
 a transistor controlled by the analog signal from the receiving means; and
 output voltage control means connected to the transistor to output the quantized analog signal to the coding means in response to the analog signal, wherein the output voltage control means includes a pull-up resistor;

coding means for coding the quantized analog signal to reconstruct the at least two bit parallel data; and reverse aligning means for aligning the at least two parallel bit data using the key clock.

2. A correlation demodulating apparatus for use with an input signal synchronized with a key clock, the input signal representing at least n-bit data, n being an integer, the correlation demodulating apparatus comprising:

a quantizing device receiving the input signal for quantizing the input signal to output a quantized signal, wherein the quantizing device includes a plurality of level detectors parallelly connected to receive the input signal to output the quantized signal, the plurality of level detectors includes at least ($2^n-1$) level detectors, each level detector being configured to detect different voltage levels of the input signal, wherein each one of the level detectors comprises:
 a transistor controlled by the input signal from the receiving means, wherein the transistor is an NMOS transistor having a threshold voltage which turns on when the input signal is above the threshold voltage and turns off when the input signal is below the threshold voltage, the transistor is connected between a source voltage and a ground and the threshold voltage of the transistor for each level detector is different by a voltage value approximately equal to the source voltage divided by the number of level detectors in a bus decompressing apparatus; and a resistor connected to the transistor to output the quantized signal to the coding device in response to the input signal;

a coding device connected to the quantizing device to code the quantized signal to reconstruct the at least n-bit data comprising at least first and second signals; and a deconverter connected to output lines of the coding device to receive the first and second signals and to output the first and second signals in sequence in response to the key clock.

3. The correlation demodulating apparatus of claim 2, wherein the deconverter includes a plurality of delay devices responsive to the key clock to output the first and second signals in sequence.

4. The correlation demodulating apparatus of claim 3, wherein the deconverter further includes an output control circuit responsive to the key clock to control outputs of the plurality of delay devices.

5. The correlation demodulating apparatus of claim 4, wherein the deconverter includes a first delay device receiving the first signal, a second delay device receiving the second signal, a third delay device receiving an output of the first delay device and a fourth delay device receiving an output of the second delay device.

6. The correlation demodulating apparatus of claim 5, wherein the output control circuit transfers an output of the third delay device when the key clock is a first logic level and transfers an output of the fourth delay device when the key clock is a second logic level.

7. A correlation demodulating apparatus, comprising:

means for receiving an analog signal formed by compressing at least two parallel bit data and a key clock synchronized with the analog signal;

quantizing means for quantizing the analog signal from the receiving means to form a quantized analog signal;

coding means for coding the quantized analog signal to reconstruct the at least two bit parallel data; and reverse aligning means for aligning the at least two parallel bit data using the key clock, wherein the reverse aligning means includes first, second, third and fourth flip-flops.

8. The correlation demodulating apparatus of claim 7, wherein an output of the first flip-flop and the key clock are inputs to the third flip-flop.

9. The correlation demodulating apparatus of claim 7, wherein an output of the second flip-flop and the key clock are inputs to the fourth flip-flop.

10. A correlation demodulating apparatus for use with an input signal synchronized with a key clock, the input signal representing at least n-bit data, n being an integer, the correlation demodulating apparatus comprising:

a quantizing device receiving the input signal for quantizing the input signal to output a quantized signal;

a coding device connected to the quantizing device to code the quantized signal to reconstruct the at least n-bit data comprising at least first and second signals; and a deconverter connected to output lines of the coding device to receive the first and second signals and to output the first and second signals in sequence in response to the key clock, wherein the deconverter includes first, second, third and fourth flip-flops, an output of the first flip-flop and the key clock are inputs to the third flip-flop, an output of the second flip-flop and the key clock are inputs to the fourth flip-flop.

11. A correlation demodulating apparatus, comprising:

means for receiving an analog signal formed by compressing at least two parallel bit data and a key clock synchronized with the analog signal;

quantizing means for quantizing the analog signal from the receiving means to form a quantized analog signal;

coding means for coding the quantized analog signal to reconstruct the at least two bit parallel data; and reverse aligning means for aligning the at least two parallel bit data to form a single bit video signal using the key clock.

12. A correlation demodulating apparatus for use with an input signal synchronized with a key clock, the input signal representing at least n-bit data, n being an integer, the correlation demodulating apparatus comprising:

a quantizing device receiving the input signal for quantizing the input signal to output a quantized signal;

a coding device connected to the quantizing device to code the quantized signal to reconstruct the at least n-bit data comprising at least first and second signals; and a deconverter connected to output lines of the coding device to receive the first and second signals and to output the first and second signals in sequence to form a single bit video signal in response to the key clock.

* * * * *